US006835510B2

(12) United States Patent
Chen et al.

(10) Patent No.: US 6,835,510 B2
(45) Date of Patent: Dec. 28, 2004

(54) HYBRID PHASE-SHIFT MASK

(75) Inventors: Jang Fung Chen, Cupertino, CA (US); Roger Caldwell, Milpitas, CA (US); Thomas Laidig, Point Richmond, CA (US); Kurt E. Wampler, Sunnyvale, CA (US)

(73) Assignee: ASML Masktools B.V., Veldhoven (NL)

( * ) Notice: Subject to any disclaimer, the term of this patent is extended or adjusted under 35 U.S.C. 154(b) by 0 days.

(21) Appl. No.: 10/662,365

(22) Filed: Sep. 16, 2003

(65) Prior Publication Data

US 2004/0067423 A1 Apr. 8, 2004

Related U.S. Application Data

(63) Continuation of application No. 09/840,291, filed on Apr. 24, 2001, now Pat. No. 6,623,895, which is a continuation-in-part of application No. 09/562,443, filed on May 1, 2000, now abandoned.

(51) Int. Cl.[7] .............................. G03F 9/00; G03C 5/00
(52) U.S. Cl. .......................... 430/5; 430/311; 430/394
(58) Field of Search .......................... 430/5, 311, 313, 430/394

(56) References Cited

U.S. PATENT DOCUMENTS

| 4,902,899 A | 2/1990 | Lin et al. |
|---|---|---|
| 5,229,255 A | 7/1993 | White |
| 5,242,770 A | 9/1993 | Chen et al. |
| 5,256,505 A | 10/1993 | Chen et al. |
| 5,288,569 A | 2/1994 | Lin |
| 5,302,477 A | 4/1994 | Dao et al. |
| 5,324,600 A | 6/1994 | Jinbo et al. |
| 5,348,826 A | 9/1994 | Dao et al. |
| 5,354,632 A | 10/1994 | Dao et al. |
| 5,362,584 A | 11/1994 | Brock et al. |
| 5,362,591 A | 11/1994 | Imai et al. |
| 5,384,219 A | 1/1995 | Dao et al. |

(List continued on next page.)

FOREIGN PATENT DOCUMENTS

| EP | 0 620 498 | 10/1994 |
|---|---|---|
| EP | 1 122 603 | 8/2001 |
| JP | 11223930 | 8/1999 |
| WO | 99/47981 | 9/1999 |

OTHER PUBLICATIONS

Fourmun Lee and Tom Zirkle, "Process for Hybrid Phase–Shifting Mask Fabrication," Mar. 1, 1993, pp. 1–2.
Toh, et al., "Optical Lithography with Chromeless Phase–Shifted Masks", SPIE vol. 1463, pp. 74–86.
Levenson, et al., "SCAA Mask Exposures and Phase Phirst Design for 110nm and Below", Proc. SPIE vol. 4346, pp. 817–826.
Watanabe, et al., "Sub–quarter–Micron Gate Pattern Fabrication Using a Transparent Phase Shifting Mask", J. Vac. Sci, Technol, B, vol. 9, No. 6, Nov./Dec. 1991, pp. 3172–3175.
Watanabe, et al., "Transparent Phase Shifting Mask", IEDM 90, pp. 33.2.1 to 33.2.4.

Primary Examiner—S. Rosasco
(74) Attorney, Agent, or Firm—McDermott Will & Emery LLP

(57) ABSTRACT

A method of forming a hybrid mask for optically transferring a lithographic pattern corresponding to an integrated circuit from the mask onto a semiconductor substrate by use of an optical exposure tool. The method includes the steps of forming at least one non-critical feature on the mask utilizing one of a low-transmission phase-shift mask (pattern) and a non-phase shifting mask (pattern), and forming at least one critical feature on the mask utilizing a high-transmission phase-shift mask (pattern).

33 Claims, 13 Drawing Sheets

U.S. PATENT DOCUMENTS

| | | |
|---|---|---|
| 5,424,154 A | 6/1995 | Borodovsky |
| 5,436,095 A | 7/1995 | Mizuno et al. |
| 5,447,810 A | 9/1995 | Chen et al. |
| 5,538,815 A | 7/1996 | Oi et al. |
| 5,605,775 A | 2/1997 | Watanabe |
| 5,618,643 A | 4/1997 | Dao et al. |
| 5,633,102 A | 5/1997 | Toh et al. |
| 5,663,893 A | 9/1997 | Wampler et al. |
| 5,707,765 A | 1/1998 | Chen |
| 5,723,233 A | 3/1998 | Garza et al. |
| 5,795,685 A | 8/1998 | Liebmann et al. |
| 5,807,649 A | 9/1998 | Liebmann et al. |
| 5,821,014 A | 10/1998 | Chen et al. |
| 5,827,623 A | 10/1998 | Ishida et al. |
| 5,858,580 A | 1/1999 | Wang et al. |
| 5,882,827 A | 3/1999 | Nakao |
| 6,114,071 A | 9/2000 | Chen et al. |
| 6,210,841 B1 | 4/2001 | Lin et al. |
| 6,258,493 B1 | 7/2001 | Wang et al. |
| 6,458,495 B1 | 10/2002 | Tsai et al. |

HYBRID PHASE-SHIFT MASK

This application is a continuation of application Ser. No. 09/840,291 filed Apr. 24, 2001, now U.S. Pat. No. 6,623,895 which is a CIP of 09/562,443 filed May 1, 2000 now abandonded.

FIELD OF THE INVENTION

The present invention relates to the design of photomasks ("masks") for use in lithography, and more particularly, to the use of a hybrid mask which provides for the formation of both phase-shifted and non-phase-shifted features with a single exposure.

The present invention also relates to the use of such a mask in a lithographic apparatus, comprising for example:

- a radiation system for supplying a projection beam of radiation;
- a mask table for holding the mask;
- a substrate table for holding a substrate; and
- a projection system for projecting at least part of a pattern on the mask onto a target portion of the substrate.

BACKGROUND OF THE INVENTION

Lithographic apparatus can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

Although specific reference may be made in this text to the use of lithographic apparatus and masks in the manufacture of ICs, it should be explicitly understood that such apparatus and masks have many other possible applications. For example, they may be used in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

U.S. Pat. No. 5,340,700 (incorporated herein by reference) describes a method of printing sub-resolution features defined by image decomposition. More specifically, the method discloses first decomposing the sub-resolution features into much larger features such that the feature edges are separated far enough from each other so that the aerial images of the feature edges are "non-correlated" to one another. In other words, the edges are optically "isolated." By exposing such a decomposed mask with pre-determined multiple exposure steps, it was shown that near-half-wavelength contact hole features can be well defined. For printing line features, the method of U.S. Pat. No. 5,340,700 utilizes negative-acting photoresist, because as the negative-acting photoresist has inherently poorer resolution, the multiple exposure, image de-composition method is best suited for printing contact hole features. Although it has very high printed resolution potential, the method disclosed in U.S. Pat. No. 5,340,700 has not yet been widely adopted in the industry, mainly due to the relative complexity of decomposing the images. Moreover, any method utilizing multiple exposure masking steps negatively impacts the throughput of the lithographic exposure apparatus.

In recent years, the phase-shift mask ("PSM") has been gradually accepted by the industry as a viable alternative for sub-exposure-wavelength manufacturing. Since the early design (Levenson et al., 1982), many forms of PSM have been developed over the years. Of those, two fundamental forms of PSM have been investigated the most, namely alternating PSM ("altPSM") as illustrated in FIGS. 1(a) and 1(b) and attenuated PSM ("attPSM") as illustrated in FIG. 2.

From the image formation point of view, for approximately a 1:1 ratio of line:space features, altPSM eliminates the $0^{th}$ diffraction order and forms the image pattern with two beans, namely $+/-1^{st}$ diffraction orders. This type of PSM is also referred to as "strong" PSM. "Weak" PSM refers to the existence of a $0^{th}$ diffraction order component for image formation. The stronger the PSM, the smaller the $0^{th}$ diffraction order component, and vice versa. In theory, altPSM can form image patterns at double the original spatial frequencies. Hence, pattern resolution can be twice as fine. AltPSM is often referred to as "strong" PSM since it offers the best resolution improvement potential. To achieve the highest possible resolution potential for altPSM, it is common to use relatively coherent illumination. However, this intensifies the already very strong optical proximity effect (OPE). Such a strong OPE essentially limits the use of altPSM for a wide range of feature pitches, mainly due to the difficulty of getting critical dimension (CD) variations under control.

An altPSM can be either a clear field or a dark field mask, as shown in FIGS. 1(a) and 1(b). As shown in both FIGS. 1(a) and 1(b), the features 10 are disposed between 0-π phase-shifting pairs formed by elements 14 and 12. In the Figures, S indicates the mask substrate (carrier plate)—e.g. made of quartz or $CaF_2$—and C indicates chrome areas. Currently, there are significant obstacles for implementing clear field altPSMs for mask designs; one is the near-impossible task of assigning 0-π phase pairs without creating phase conflicts: often, many design compromises must be made or the effectiveness of resolution enhancement has to be substantially reduced. Moreover, for the phase transitions (from 0 to π or vice versa) that occur in unintended areas, undesirable resist patterns will be formed. In order to correct the foregoing, either highly complicated phase transitions or resort to an additional exposure mask for eliminating these undesirable resist patterns must be utilized (see, e.g. U.S. Pat. Nos. 5,573,890 and U.S. Pat. No. 5,858,580, incorporated herein by reference).

Of late, substantial attention has been given to dark field implementations. This is partially due to the fact that the phase assignment issue is easier to deal with and the unwanted resist patterns can effectively be "trimmed" by a second exposure mask. In order to make use of dark field altPSM for line/space patterns, two exposure masks are required—one is a non-phase-shifted chrome mask and the other exposure mask is a dark field altPSM. For a typical implementation, the altPSM is only to be used for "trimming" the width of the gate electrode features after the chrome mask exposure has been made. Since the binary chrome mask is a clear field type, this exposure mask also serves to eliminate unwanted resist patterns formed by unintended phase transitions during the altPSM exposure. An example of the foregoing is shown in FIGS. 3(a) and 3(b), which illustrate resulting resist patterns. Specifically, FIGS. 3(a) and 3(b) illustrate the optical proximity effect of the dark field altPSM, and that the aerial image intensity (1) can be influenced by the size and proximity of the 0-π window pairs, illustrated as elements 20 and 22.

Although the complexity of phase assignment can be greatly reduced with dark field altPSM, the issue of overly strong optical proximity effects (OPE) can still severely limit the control of critical dimension for gate features. When the lengths and widths of 0-π window pairs are in sub-micron dimensions, they can be susceptible to strong OPE. The proximity of neighboring 0-π pairs, and 0-π-0 or π-0-π windows, also causes strong OPE, as shown in FIGS. 3(a) and 3(b). Another form of OPE is the corner rounding effect. Due to the use of relatively coherent illumination, electric fields are much stronger in the corners. If the length of the 0-π window pair is not sufficiently great, the printed window patterns become oval shaped. Thus, the "trimmed" gate features will then become curved, as shown in FIGS. 5(a)–5(d). Although aggressive optical proximity correction (OPC) could be applied, the added mask design complexity and the still strong residual OPE imposes a fundamental limit on minimum feature pitch. Further, as mentioned above, the two required exposures disadvantageously reduce the throughput of the lithographic exposure apparatus.

AttPSM has been customarily described as "weak" PSM. For KrF exposure wavelength applications, the commercially available attenuated mask blanks have a range of 5% to 8% transmission of the actinic wavelength. AttPSM does allow the $0^{th}$ diffraction order to form image patterns, so the resolution enhancement potential is not as good as altPSM. On the other hand, it has a lesser degree of OPE. In addition, the mask design is much less complicated as compared to altPSM, since the design of 5%–8% attPSM is no different from the binary chrome mask when it comes to making line/space style mask patterns. In order to obtain better resolution, it has been observed that the use of higher % transmission is necessary, since the magnitude of the $0^{th}$ diffraction order is then further reduced. Hence, the best possible resolution enhancement for attPSM is one that has no actinic wavelength attenuation, such as a chromeless phase-shifted mask ("CLM") as shown in FIG. 4.

The present inventors disclosed in European Patent Application EP 0 980 542 (incorporated herein by reference) that CLM could be used in conjunction with incoherent illumination (σ>0.6) for better CD control. Using advanced off-axis illumination ("OAI"), the patterning performance can be still further improved. It has been shown that halftone CLM with OAI can print feature widths one-quarter of the exposure wavelength in size. However, the down side for such a high % transmission is the leak-through of the actinic wavelength during the exposure. This occurs when the two phase-edges are separated far enough apart that destructive interference cannot be formed. The resist will then be exposed to cause undesirable patterns. To prevent this, "wide-open" areas must either be blanked by the opaque chrome or with periodic phase edge patterns (halftoning patterns) to ensure continuous dark interference for the entire pattern area. In order to avoid dealing with complex proximity effects, currently both methods have been restricted to very large feature patterns.

Accordingly, there remains a need for a photomask that allows for the printing of high resolution "critical" features, while simultaneously allowing for the printing of low resolution "non-critical" features, so as to reduce the overall need for optical proximity correction techniques and provide improved CD control for "critical" features.

SUMMARY OF THE INVENTION

In an effort to satisfy the aforementioned needs, it is an object of the present invention to provide a "hybrid" mask, wherein only the critical features of the desired device to be imaged (e.g. integrated circuit) are formed by strongly phase-shifted mask patterns, and the other "non-critical" features are formed by either weak-phase-shifted or non-phase-shifted chrome mask patterns.

More specifically, the present invention relates to a "hybrid" mask, wherein the high-resolution fine mask features, such as the gate electrodes of integrated circuits, are designed with a high % (e.g. >10%) transmission attPSM (or a CLM), while the coarser features, such as local interconnects and contact landing pads, are designed with either non-phase-shifting chrome or the standard (e.g. 5–8%) low transmission. Importantly, both the fine mask features and the coarser features are formed simultaneously by a single exposure of the hybrid mask of the present invention.

The present invention also relates to a method of forming the hybrid mask. The method includes the steps of forming at least one non-critical feature on the mask utilizing one of a low-transmission phase-shift mask (pattern) or a non-phase shifting mask (pattern), and forming at least one critical feature on the mask utilizing a high-transmission phase-shift mask (pattern).

As described in further detail below, the present invention provides significant advantages over the prior art. Most importantly, the hybrid photomask of the present invention allows for the printing of high resolution "critical" features, while simultaneously allowing for the printing of low resolution "non-critical" features, thereby reducing the overall need for optical proximity correction techniques and providing for improved CD control for "critical" features.

In addition, because the hybrid mask of the present invention requires only one exposure to form the desired features, the overall throughput of the manufacturing process is advantageously increased by eliminating the need for performing a double exposure and alignment.

Additional advantages of the present invention will become apparent to those skilled in the art from the following detailed description of exemplary embodiments of the present invention.

The invention itself, together with farther objects and advantages, can be better understood by reference to the following detailed description and the accompanying schematic drawings.

BRIEF DESCRIPTION OF THE DRAWINGS

FIG. 5(a) illustrates the desired feature mask 23 (M1) containing features 24 and 26, the alternating PSM 25 (M2) containing 0-π phase-shifting elements 28 and 30, and the resulting combined exposure mask 27 (MC). FIG. 5(b) illustrates the simulated 2D aerial image obtained utilizing the combined exposure mask (where I is intensity). FIG. 5(c) illustrates the contour of the-developed resist. FIG. 5(d) illustrates that the features obtained do not have straight edges (as indicated by the arrows). The curved edges result from the strong OPE in the corners of the 0-π window pairs.

FIGS. 7(a)–7(f) illustrate an example of a typical mask fabrication process sequence in accordance with the present invention.

In the Figures, like symbols indicate like parts.

DETAILED DESCRIPTION OF THE INVENTION

The following detailed description of the "hybrid" mask of the present invention relates to both the mask itself as well as a method of forming the mask. It is noted that, in an effort to facilitate the understanding of the present invention, the following description details how the hybrid mask can be utilized to form "critical" gate features contained in today's state-of-the-art complementary metal oxide ("CMOS") devices. However, it is also noted that the present invention is not limited to use in CMOS devices. Indeed, the present invention can be utilized in a multitude of different types of semiconductor designs and processes for the formation of such semiconductors, as well as in the formation of other devices, such as thin-film heads, magnetic domain memories, micro-mechanical devices, etc.

When fabricating integrated circuits (IC), the most critical masking layer is the gate electrode mask. In particular, when manufacturing state-of-the-art CMOS devices, the width of the gate electrode determines the speed performance. In order to obtain a high-performance IC, smaller, more uniform gate features are essential. In fact, the foregoing is one of the key objectives for the ever-shrinking IC.

Figure 1A:
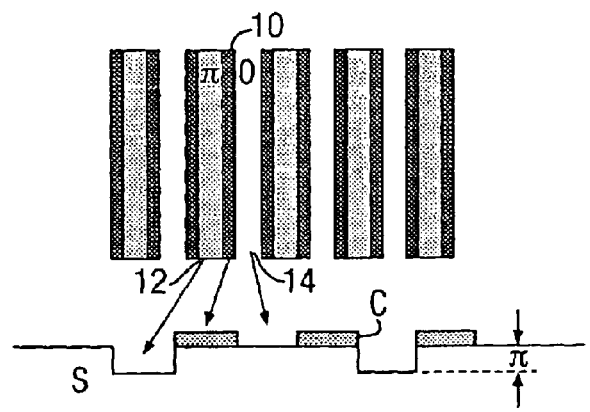
FIG. 1(a) illustrates an example of a clear field alternating phase-shift mask.
Figure 1B:
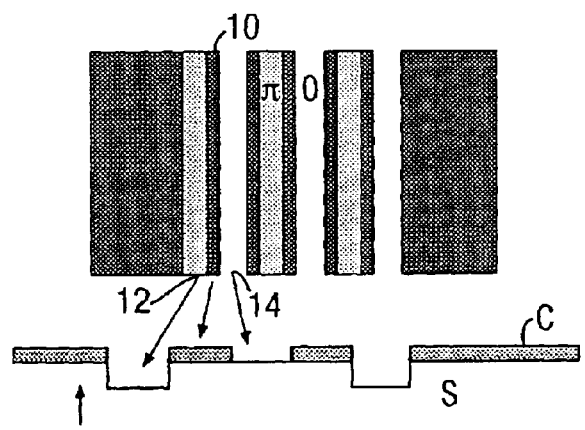
FIG. 1(b) illustrates an example of a dark field alternating phase-shift mask.
Figure 2:
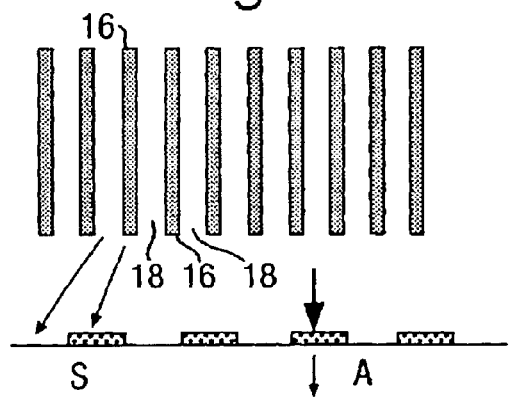
FIG. 2 illustrates an example of an attenuated phase-shift mask having 0-π phase-shifting pairs 16 and 18.
Figure 3A:
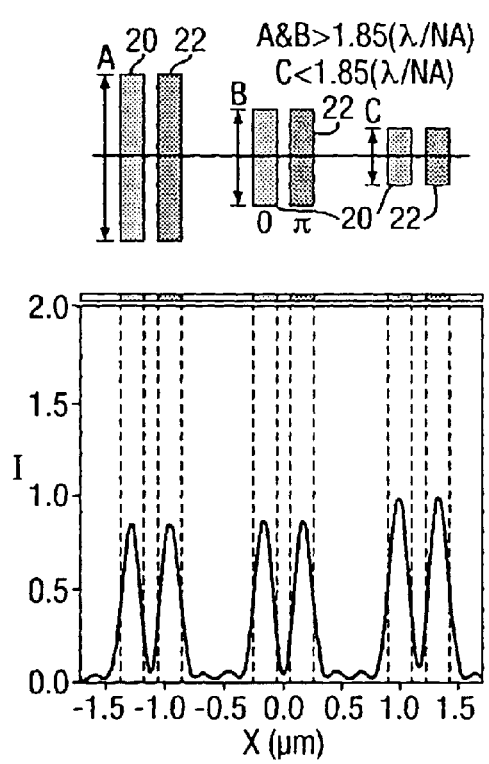
FIGS. 3(a) and 3(b) illustrate the optical proximity effect of a dark field alternating PSM. As shown, the aerial image intensity can be influenced by the size and proximity of the 0-π window pairs.
Figure 3B:
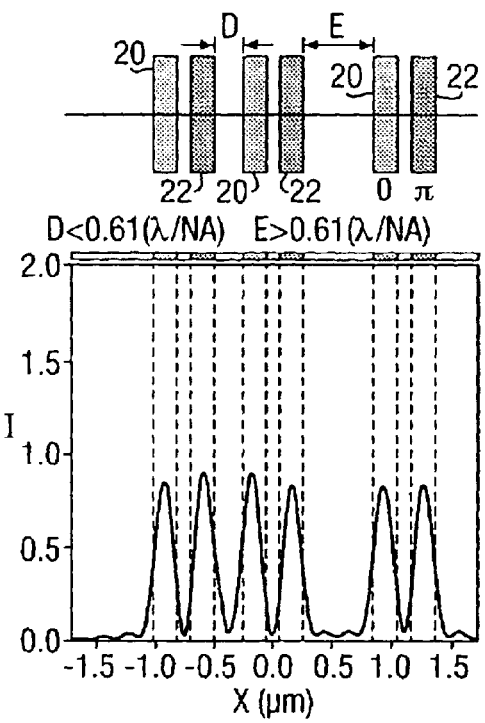
Figure 4:
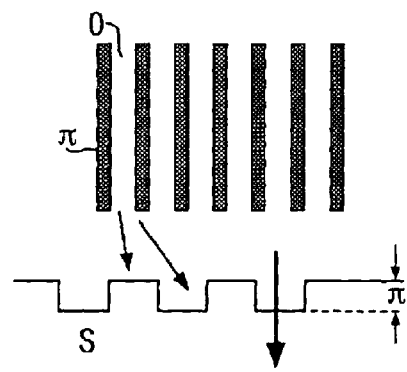
FIG. 4 illustrates an example of a chromeless phase-shift mask (CLM).
Figure 5A:
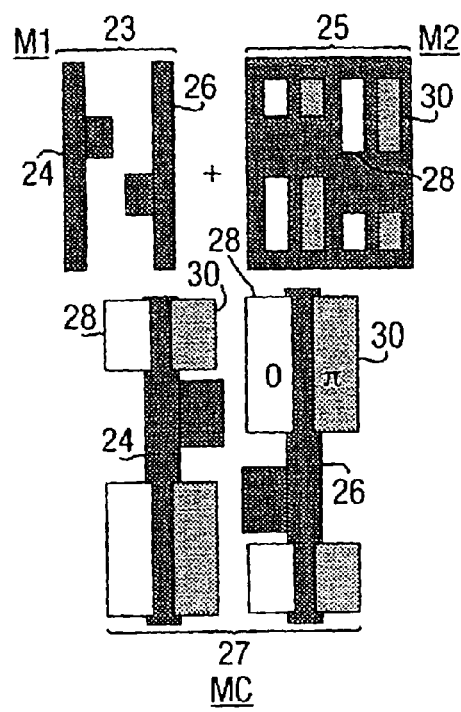
FIGS. 5(a)–5(d) illustrate an example of optical proximity effects resulting from the use of an alternating PSM.
Figure 5B:
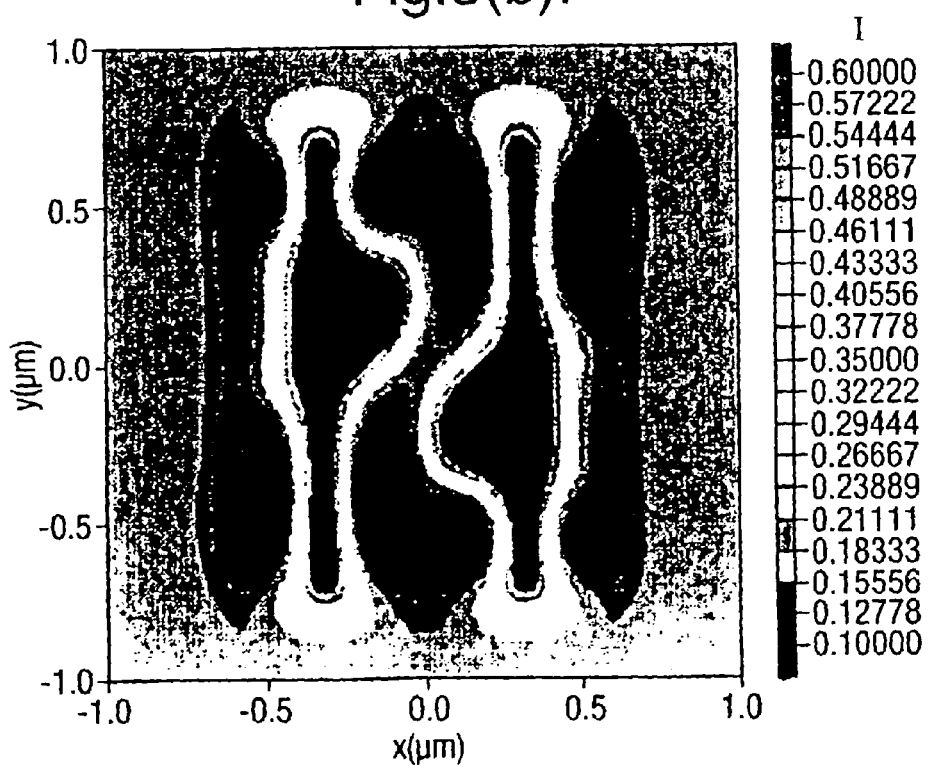
Figure 5C:
Figure 5D:
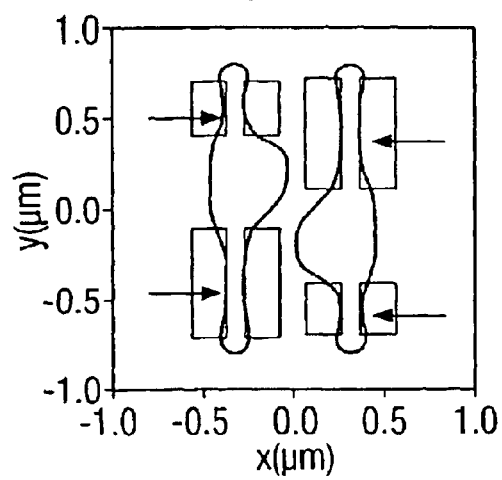
Figure 6A:
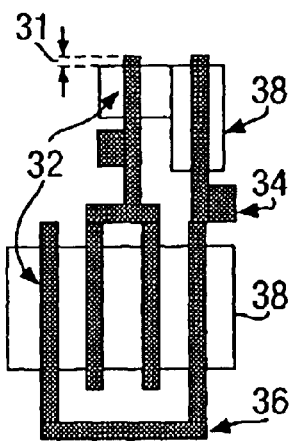
FIG. 6(a) illustrates an example of a logic circuit design that has overlaid a gate electrode and an active area mask layout.

Referring to FIG. 6(a), within a typical gate mask, there are three major types of design features—the gate electrodes 32, the landing pads 34 for contacts, and the local interconnect traces 36. When shrinking the device, the design rules for all three types must be proportionally scaled down at the same time. However, the dimensional design rules for the contact landing pads 34 and local interconnect traces 36 are more relaxed than for the gate features. This is due to the limitation of the alignment accuracy by the exposure apparatus used, and the need to maintain scaled relationships to the corresponding masking layers such as contact and active area 38 masking layers.

For a gate feature, the most critical dimension is the portion that is directly responsible for forming the gate electrode 32. Typically, this critical portion can be identified by overlaying the active area mask and the gate mask using a logic AND operation. This is easily done in today's computer-aided layout design (CAD) tool. FIG. 6(a) shows an example of a logic circuit design that has overlaid the gate and the active area mask layout. The critical gate features are thus easily identified. In particular, the gate and the active overlaid area are referred to as the active region. The portion of the gate feature within this overlaid area is the critical gate feature.

It is noted that, unlike earlier generations, the scaling down of the IC is now facing much higher barriers than ever before. There are many limitations due, for example, to the lithographic exposure apparatus used in manufacturing an IC. Increasingly, tighter alignment tolerances and the migration from the 248 nm Krypton Fluoride (KrF) excimer laser to the 193 nm Argon Fluoride (ArF) source, and beyond (e.g. 157 nm, EUV), demand more stringent control. As such, it becomes readily apparent that maintaining a universally shrinking ratio for all circuits to obtain a smaller die size is less feasible in light of the current lithography limitations. However, by utilizing the present invention, it is possible to aggressively shrink the gate electrode features 32 while limiting the minimal shrink ratio for the contact landing pads 34 and interconnect features 36.

In one embodiment of the present invention, the novel hybrid mask is utilized to form a CMOS device. More specifically, the hybrid mask utilizes a relatively strong PSM design for the gate electrode features 32, but for the less critical features the hybrid mask utilizes either a binary chrome or a weak PSM.

Figure 6B:
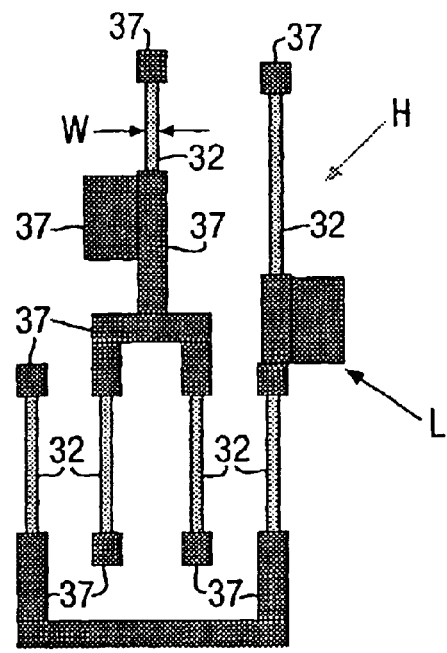
FIG. 6(b) illustrates how the design of FIG. 6(a) can be separated into less critical features and the gate electrode features (i.e. critical features), and the resulting hybrid mask formed in accordance with the present invention.

For example, FIG. 6(b) illustrates how the gate electrode features 32 (i.e. the critical features) of the logic circuit design of FIG. 6(a) are formed in accordance with the present invention. First, the gate electrode features 32 are separated from the other less critical features 37, and are placed in a separate layout data file from the non-critical features. The gate electrode features 32 are then designed utilizing a PSM, and the less critical features 37 are designed utilizing, for example, non or weak PSM. The two separate layout data files are then combined to form the hybrid phase-shift mask shown in FIG. 6(b).

As shown in FIG. 6(b), all of the critical gate features 32 are formed utilizing a higher % transmission PSM (indicated as H), while the less critical gate features are formed utilizing a lower % transmission PSM or weak PSM (indicated as L); W denotes the gate electrode width.

In general, the design of the hybrid mask of the present invention requires the following design steps:

(1) Segregation of the critical features (e.g. the gate electrode features), using generic AND/AND-NOT logic operations in a CAD layout tool. The critical features are then placed in a separate layout layer as set forth above.

(2) Utilization of a CAD tool to design the critical features according to a pre-determined set of PSM-OPC rules (e.g. a high % (>10%) transmission attPSM or a CLM), and design of the non-critical features, such as local interconnects, either by non-phase-shifting chrome or the standard 5–8% low-transmission attPSM.

(3) Utilization of two writing passes with corresponding processing to fabricate the hybrid mask. More specifically, the third step comprises the following processing procedures: (i) re-spinning the photoresist, (ii) re-aligning to the first writing pass and exposing the opening area, and (iii) developing the exposed photoresist area.

A typical mask fabrication process sequence is illustrated in FIGS. 7(a)–7(f). More specifically, in the example presented, it is desired to form the two features illustrated in FIG. 7(a). The first feature 42, which is positioned vertically, represents the feature requiring high resolution. The second feature 44, which is positioned horizontally, represents the less critical component requiring a reduced level of resolution.

As set forth above, the hybrid mask comprises a weak phase-shift feature (e.g. 4–6% attenuated PSM) utilized to form feature 44 and a strong phase-shifted feature (e.g. chromeless PSM) utilized to form feature 42. "Weak" PSM is defined as a lower % transmission as compared to the strong PSM. For example, if the strong PSM is defined as 18%, then the weak can be 6% or lower (approximately 10–12 percentage points less transmission). If the % transmission is zero, then it is non-phase shifted. If the strong PSM is chromeless (100%), then 18% transmission would constitute weak PSM. Other types of weak phase shifting can be expressed in terms of the degree of phase shifting. For example, a 180-degree phase shift represents strong PSM, in which case a 90-degree or a 60-degree phase shift represents weak PSM. As is clear from the foregoing, strong PSM and weak PSM are defined relative to one another.

Figure 7A:
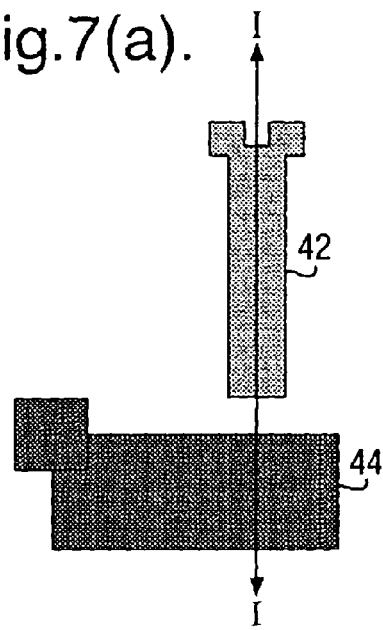
Figure 7A:
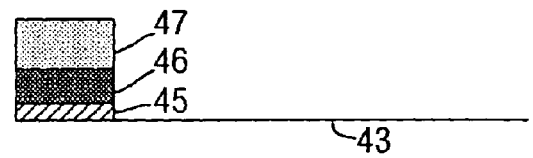
Figure 7A:
Figure 7A:
Figure 7A:
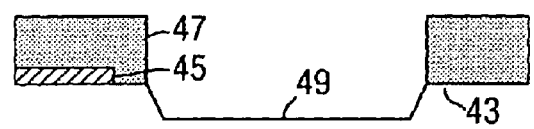
Figure 7A:
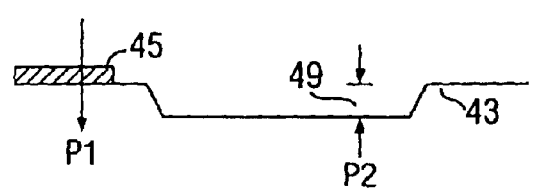

Referring to FIGS. 7(b)–(f), an exemplary embodiment of the formation process of the hybrid mask representing the features illustrated in FIG. 7(a) is now described. It is noted that FIGS. 7(b)–7(f) represent the cross-section of the hybrid mask taken along line I—I of FIG. 7(a). The first step of the process, as shown in FIG. 7(b), defines the weak or non-phase shifted pattern and requires depositing a MoSi layer 45 on a quartz substrate 43, then depositing a chrome layer 46 on the MoSi layer 45, and finally depositing a photoresist layer 47 over the entire substrate. The photoresist is then exposed and removed in a manner such that the MoSi layer 45, the chrome layer 46 and the photoresist 47 remain at locations defining the non-critical features 44, as shown in FIG. 7(b). It is noted that the three foregoing layers and the selected removal thereof can be accomplished using standard techniques known in the industry.

In step 2, referring to FIG. 7(c), the photoresist layer 47 and the chrome layer 46 remaining over the MoSi layer 45 are removed. Again, these layers are removed utilizing standard techniques. The MoSi portions 45 remaining on the substrate define the non-critical features 44 to be formed. Thus, upon completion of step 2, the first mask writing step is complete and the non-critical features 44 are defined.

Steps 3–5 of the process represent the second mask writing step and define the critical features 42 requiring strong phase-shift patterns. Referring to FIG. 7(d), in step 3, the entire substrate 43 is once again covered with photoresist 47, and then the photoresist 47 is exposed and removed in a manner such that only the portions of the quartz substrate 43 corresponding to the critical features 42 to be formed are exposed. Then, referring to FIG. 7(e), in step 4, the quartz substrate 43 is etched so as to create a chromeless PSM 49. In the embodiment shown, the quartz substrate 43 is etched so as to form a T phase-shift. Finally, referring to FIG. 7(f), the remaining photoresist 47 is removed, and the resulting structure is a hybrid mask capable of forming both non-critical features utilizing weak or non-phase-shifted patterns and critical features utilizing strong phase-shifted patterns, simultaneously, via a single exposure (in the Figure, P1 denotes a 4–6% attPSM and P2 denotes a n phase-shift in quartz). It is noted that while FIGS. 7(a)–7(f) illustrate formation of only a single non-critical feature and a single critical feature, in practice a typical hybrid mask would comprise a multitude of critical and non-critical features. As is clear from the foregoing process, in such an embodiment, preferably all of the non-critical features are formed at the same time, followed by the formation of all of the critical features. Of course, other formation sequences are possible.

It is further noted that, in the current embodiment, as the hybrid mask utilizes a weak phase-shift feature (e.g. 4–6% attenuated PSM) to form the non-critical components, it is acceptable to utilize molybdenum-silicide-(MoSi)-film-based attenuated PSM blanks as illustrated above. Of course, the present invention is not limited to the use of MoSi films. For example, embedded phase-shifting chrome material or a $CrF_2$ film can be utilized as an alternative. However, if non-phase-shifted features are desired, then, for example, a regular chrome blank can be utilized as the starting material. In such an embodiment, the fabrication process steps are essentially the same as those described above and as shown in FIGS. 7(b)–7(f) except that there is no MoSi layer involved, and therefore there is a reduction in the necessary number of process steps.

As is clear from the foregoing, the hybrid mask of the present invention requires two mask-writing steps. As such, it is necessary for the second mask writing step to align with the first mask writing step. As this alignment typically occurs on the 4× or 5× mask level, the accuracy requirement is not as critical as for the "trim PSM mask" where the two exposure steps take place on the 1× wafer surface. However, it is important to have alignment accuracy better than approximately 50 nm at mask level. This requirement translates to approximately 12.5 nm accuracy at 1× wafer level if a 4× mask is used. As currently available tools/devices provide for mask writer alignment accuracy better than 50 nm, the present invention can be implemented utilizing currently available equipment.

In developing the hybrid mask of the present invention, it has been observed that four types of OPE can occur utilizing such a hybrid mask, namely, adjacent PSM features, line-end shortening, angled PSM features and feature transition from strong PSM to the weak or non-phase-shifted features. It is possible for these effects to result in unacceptable errors regarding dimensional control. OPC methods for correcting the foregoing OPEs are now discussed, along with the masking requirements.

1. OPC for Line and Space PSM Features

Referring again to FIG. 6(b), the critical gate electrode features 32 can be extracted as arrays of vertical and horizontal line features. This greatly reduces the complexity of the OPE. Specifically, since all the adjacent features essentially have the same line width, the PSM design and the OPC can be done in a relatively straightforward fashion. For example, the OPC can be applied using only scattering bars (SB) or with scattering-bar-plus-feature biasing, as detailed in U.S. Pat. No. 5,242,770, U.S. Pat. No. 5,447,810, U.S. Pat. No. 5,707,765 and U.S. Pat. No. 5,821,014 (incorporated herein by reference). Typically, the OPC application is accomplished by adding SB and/or bias to the actual design features based on a pre-determined set of OPC rules.

Moreover, it is possible to develop a set of OPC rules based on the space widths between the adjacent line features.

Such OPC rules can be determined by first checking the critical feature width (CD) as a function of feature spacing (or pitch). As a result of optical proximity effects, the CD is expected to be different at different spacings. An optimum SB and/or feature biasing setting for a given feature spacing can be determined experimentally or via aerial image simulation utilizing a calibrated resist patterning model. As such, the OPC rules for each feature spacing can be obtained.

The foregoing approach allows for shrinking the gate electrode features 32 without changing the overall layout design rules. For example, for chip design rules based on 0.18 μm line width, the minimum feature pitch could typically vary between 0.36 and 0.60 μm. Although the gate line width has been re-targeted to be, for example, between 0.07 μm and 0.10 μm, it is likely that the feature pitch will have to be kept the same. Since the same exposure apparatus (in terms of exposure wavelength and numerical aperture) is used, it has been observed that the scattering bar (SB) OPC method (see U.S. Pat. No. 5,242,770, U.S. Pat. No. 5,447,810 and U.S. Pat. No. 5,707,765) can be applied. In this case, the SB features can be utilized to form the weak or non-phase-shifted features of the hybrid mask.

In other words, only the gate width is being reduced, not the feature-to-feature pitch as originally designed. For example, if the original design feature pitch is 0.36 μm with a gate width of 0.18 μm, the gate feature-to-feature space is 0.18 μm (for a total 0.36 μm-feature pitch). The hybrid mask of the present invention allows for a reduction in the gate width to 0.10 μm. The feature spacing then becomes 0.26 μm because there was no change in the feature pitch (0.36 μm).

In the foregoing example, the SB OPC method can still be utilized. Specifically, because strong PSM was utilized for the gate electrode feature, it is possible to use the weaker PSM or non-phase-shifting feature for the SB OPC features, such that the SB OPC features do not become printable. Moreover, with the hybrid mask, the gate feature space becomes wider since the gate feature pitch remains the same. This requires a change of OPC rules because the SB OPC method is primarily based on the feature spacing.

Figure 8A:
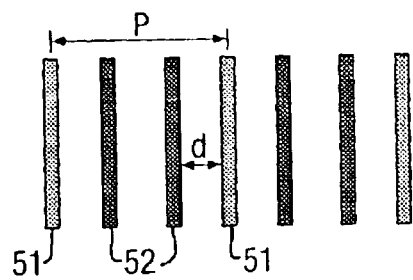
FIGS. 8(a)–8(c) illustrate how scattering bars can be utilized in conjunction with the hybrid mask of the present invention, and the results obtained by incorporating scattering bars into the hybrid mask.

Table I shows a sample set of OPC rules based on 0.18 μm design rules with the gate electrodes shrunk to 0.08 μm target CD. FIG. 8(a) illustrates an OPC example for the CD feature pitch at 0.1 μm. More specifically, FIG. 8(a) illustrates an example of SB OPC at a PSM feature pitch (P) of 1.0 μm. The PSM main feature 51 width has been biased to become 0.075 μm. The scattering bar 52 width is 0.08 μm and the bars are placed at 0.24 μm away (d) from the PSM main feature edge. In the given example, the scattering bars 52 are non-phase-shifted chrome features.

Figure 8B:
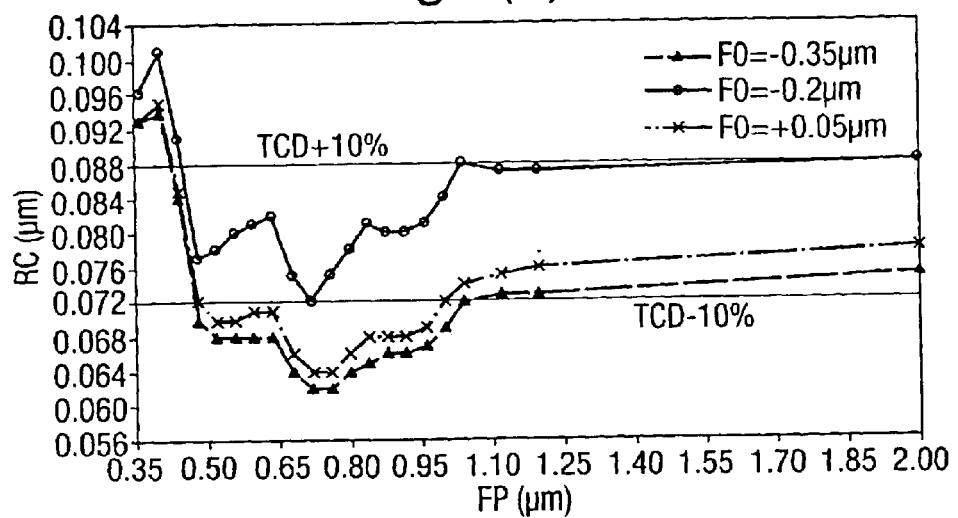
Figure 8C:
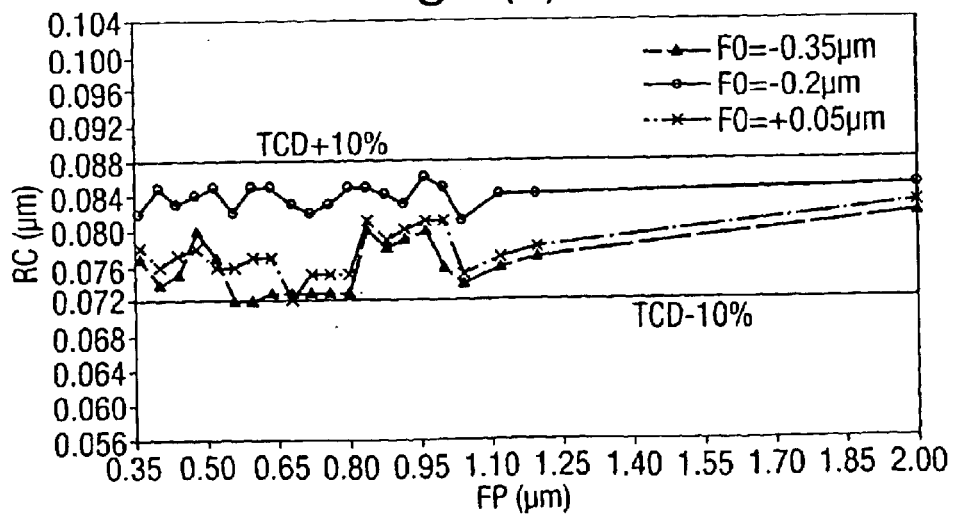

FIG. 8(b) illustrates the measured resist cross-section CD data (RC) plotted over a range of feature pitches (FP) with no OPC applied. As is shown, the OPE caused an apparent CD oscillation in the intermediate feature pitch range. In contrast, FIG. 8(c) demonstrates the performance of the scattering bar OPC method for a target CD of 0.08 μm for a feature pitch range from 0.36 to 2.0 μm. In both Figures, TCD denotes the target CD, and FO denotes focus. Comparing the two results, it is clear that the use of SB OPC is beneficial. Utilizing scattering bar OPC, under nominal exposure conditions, it is possible to obtain slightly over 0.4 μm depth of focus (DOF) for the entire feature pitch range.

TABLE I

| Feature pitch (μm) | OPC treatment (* 1X wafer scale, nm) |
| --- | --- |
| 0.360 | Bias − 7.5 nm (CD feature becomes 72.5 nm) |
| 0.400 | Bias − 7.5 nm |
| 0.440 | Bias − 5 nm |
| 0.480 | Bias + 5 nm (CD feature becomes 85 nm) |
| 0.520 | Bias + 5 nm |
| 0.560 | Bias + 2.5 nm |
| 0.600 | Bias + 2.5 nm |
| 0.640 | Bias + 2.5 nm |
| 0.680 | Bias + 5 nm |
| 0.720 | Bias + 7.5 nm |
| 0.760 | Bias − 5 nm with 80 nm SB at 300 nm away from feature edge |
| 0.800 | Bias − 5 nm with 80 nm SB at 320 nm away from feature edge |
| 0.840 | Bias − 5 nm with 80 nm SB at 220 nm, SB-to-SB separation of 160 nm |
| 0.880 | Bias − 5 nm with 80 nm SB at 240 nm, SB-to-SB separation of 160 nm |
| 0.920 | Bias − 5 nm with 80 nm SB at 260 nm, SB-to-SB separation of 160 nm |
| 0.960 | Bias − 5 nm with 80 nm SB at 240 nm |
| 1.000 | Bias − 5 nm with 80 nm SB at 240 nm |
| 1.040 | Bias − 7.5 nm with 80 nm SB at 220 nm |
| 1.120 | Bias − 7.5 nm with 80 nm SB at 220 nm |
| 1.200 | Bias − 7.5 nm with 80 nm SB at 220 nm |
| 2.000 | Bias − 7.5 nm with 80 nm SB at 220 nm |

Exposure conditions:
NA = 0.68; illumination setting = annular (0.8/0.6); λ=248 nm; exposure energies = 19.5 mJs; focus settings = −0.35 μm, −0.2 μm (center), +0.05 μm.
Process conditions:
Shipley UV6 resist, thickness = 0.33 μm; poly silicon substrate wafer; anti-reflection coating: Shipley AR2, thickness = 0.6 nm
*All dimensions are in 1X wafer scale

2. Line-End OPC

For a CMOS transistor, as is known, the poly gate must extend beyond the active area region on both sides. This is necessary to prevent any possible leakage current between the source and drain electrodes of the transistor. The portion of the gate feature that extends beyond the active area is referred to as the "endcap" 31, as illustrated in FIG. 6(*a*). The amount of endcap 31 specified in the design rules has a direct impact on the chip size. In order to save real estate, it is desirable that the endcap 31 amount be minimized.

Due to line-end shortening effects observed in nearly all lithography processes, a smaller amount of drawn endcap 31 demands more aggressive OPC. Utilizing the hybrid mask, it was observed that the line-end shortening effect is intensified by the use of PSM features. Accordingly, application of OPC techniques is necessary. In order to apply adequate OPC, the first step is to examine the amount of endcap 31. This can be done by utilizing an AND-NOT logic operation in a CAD tool to segregate the endcaps 31 for measurement and subsequent treatment.

Depending on the design rule set, the endcap 31 amount will vary from one IC design to another. It has been observed that, if the minimum dimension of the endcap 31 after performing the AND-NOT logic operation is equal to or less than 0.25 (λ/NA), or about 0.1 μm when using a state-of-the-art KrF exposure tool, then the endcap 31 is probably too small. It is noted that λ is the exposure wavelength and NA is the numerical aperture of the exposure tool. This assessment relates to the level of difficulty in mask making and the need to achieve desired OPC efficiency. In this case, it is more advantageous to remove the weak or non-phase-shifted endcap features and simply extend the PSM gate electrode line. By using serif OPC for the PSM line-end (see U.S. Pat. No. 5,707,765), it is possible to achieve a decent correction.

Figure 9A:
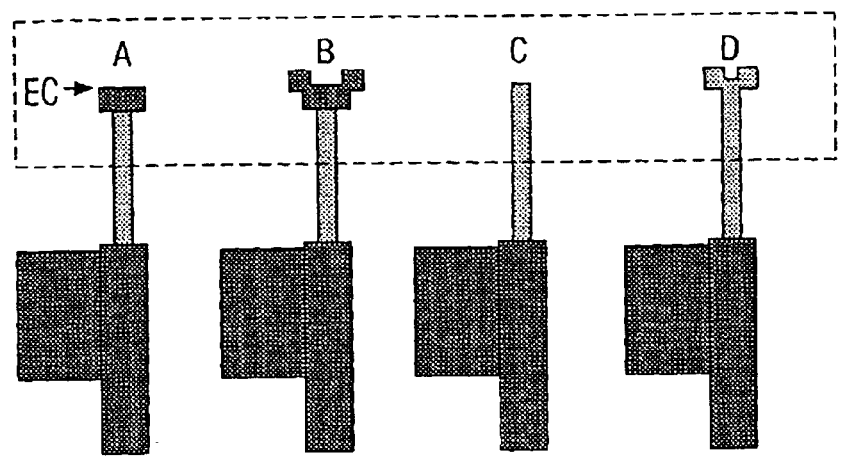
FIGS. 9(a)–9(c) illustrate various optical proximity correction styles that can be utilized to prevent line-end shortening, and the results of the correction.
Figure 9B:
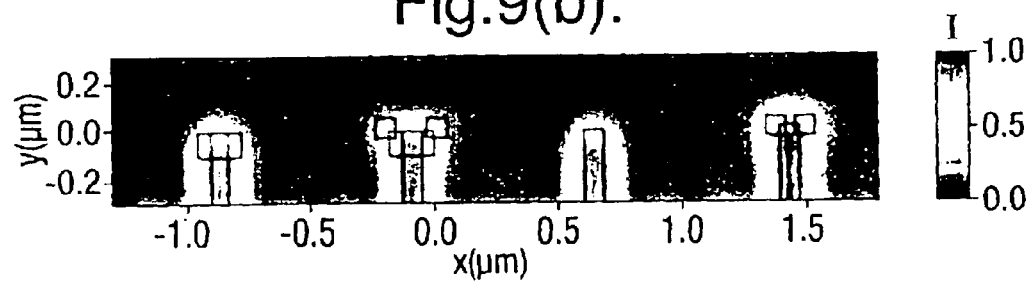
Figure 9C:
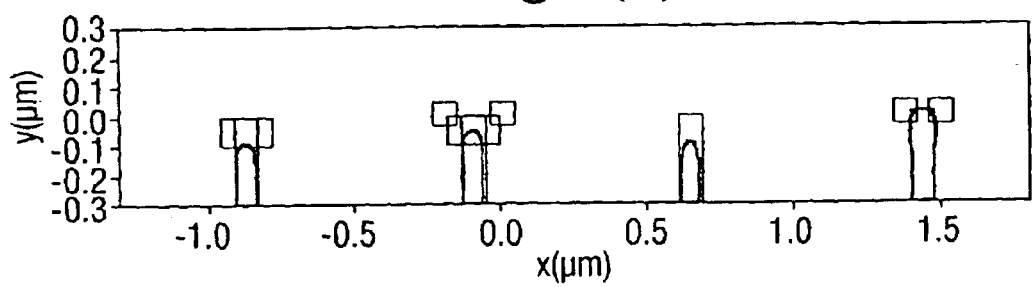
Figure 10A:
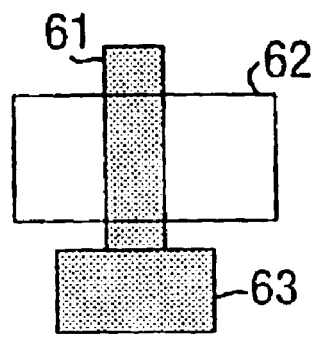
FIGS. 10(a)–10(d) illustrate an alternate method of identifying line-ends and a method of applying OPC.
Figure 10B:
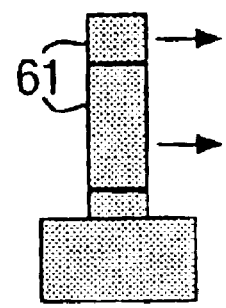
Figure 10C:
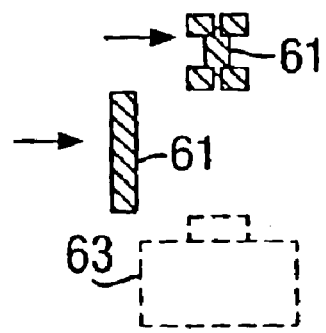
Figure 10D:
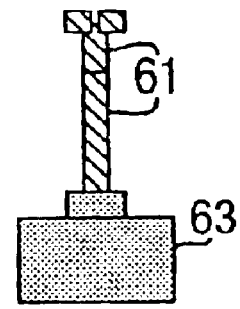

An example of the foregoing is illustrated in FIGS. 9(*a*)–9(*c*), in which EC denotes the intended endcap. FIG. 9(*a*) illustrates four possible styles of line-ends with or without OPC. Line-end style A represents a typical line-end after performing the AND-NOT logic operation. Line-end style B applies serif OPC to the endcap. Line-end style C simply extends the gate PSM feature. Finally, line-end style D applies serif OPC to the PSM line-end. FIGS. 9(*b*) [aerial images] and 9(*c*) [top-down view of resist patterns overlapped with intended layouts] show the results of the OPC. As shown, the level of correction utilizing either styles A, B or C is minimal. The best correction is obtained by utilizing style D. It is noted that the exposure conditions utilized are set forth in Table I. Moreover, if the endcap is greater than 0.25 (λ/NA), for a more robust lithography process, it may still be advantageous, though less essential, to use this OPC scheme.

It is further noted that, after the gate electrodes have been "dissected," it may be difficult to distinguish between endcaps and interconnect features. Accordingly, an alternative CAD approach is to identify the line-ends first, then use this information to separate endcaps from interconnect trace and contact pads. Thereafter, shrink the line features (for both gate electrodes and endcaps) and assign phase-shifting attributes accordingly. Next, apply both line-width and line-end OPC for the endcap features, but apply only line-width OPC for gate electrode features. Then, recombine the gate electrodes and endcaps. At the connecting joint, the endcap OPC features can be cancelled out since they now overlap the gate electrodes. This CAD operation procedure is illustrated in FIG. 10(*a*)–10(*d*).

More specifically, FIG. 10(*a*) illustrates the identification of the overlapping gate electrode 61 and the active area 62 mask. FIG. 10(*b*) illustrates the AND-NOT operation performed to dissect the gate electrode 61 and place it in a separate memory location. FIG. 10(*c*) illustrates the process of filtering out the contact-landing pad 63, and thereafter shrinking both features and assigning phase attributes. As stated, OPC is then applied to both line-width and line-end for the endcaps, and line-end OPC is applied to the gate electrode. FIG. 10(*d*) illustrates the combination of the endcap and the gate electrode, which cancels out the unwanted serif OPC. As a result, the contact-landing pad 63 and the gate electrode 61 are in separate data layers ready for mask formation.

3. OPC for Angled PSM Features

Figure 11A:
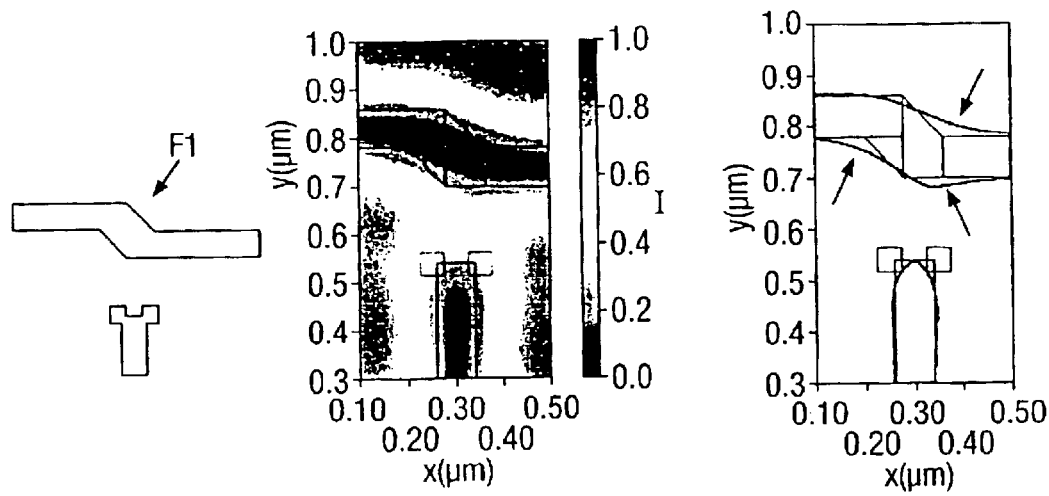
FIG. 11(a) illustrates optical proximity effects that can occur when utilizing angled features.
Figure 11B:
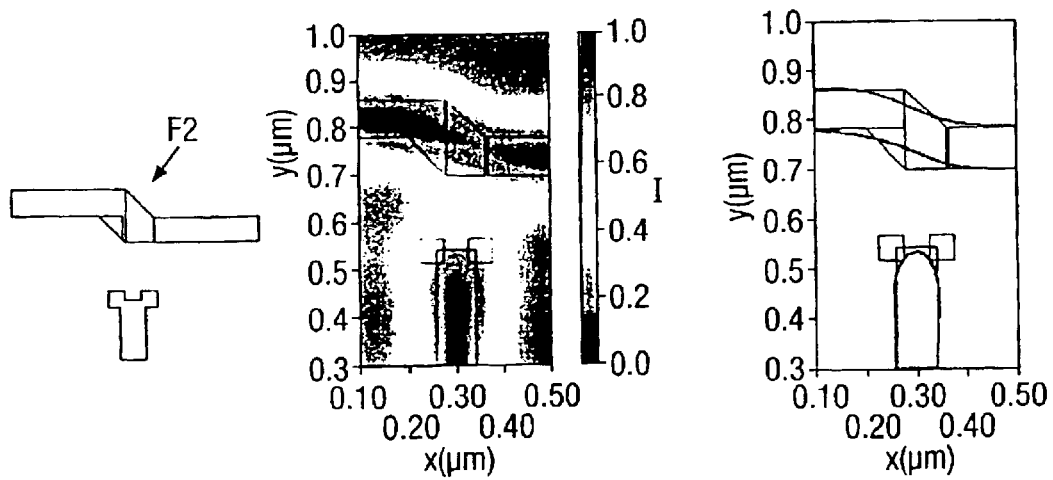
FIG. 11(b) illustrates the pattern of FIG. 11(a) corrected utilizing OPC.

While rectilinear circuit design is becoming more prevalent due to the improved resolution benefit of using off-axis illumination for lithography, angled features for memory type ICs are still quite common. In most cases, the angled features are mainly used for local interconnect. Hence, CD control is not as critical as for gate features. Nevertheless, in order to design smaller memory cells, the angle feature CDs are nearly the same as those of the gates. It has been observed that, if strong PSM is used for angled features, the OPE could be too excessive to control. Consequently, neighboring gate features can be overly distorted, as shown in FIG. 11(*a*). Since the objective is to target the desired CD for the angled features, it has been observed that, by utilizing weak or non-phase-shifted design, the OPE can be minimized, and with proper sizing rules, reasonable printed patterns can be obtained, as shown in FIG. 11(*b*). In FIG. 11(*a*),(*b*), F1 denotes strong phase-shifted angle features and F2 denotes non-phase-shifted angle features.

4. OPC for Feature Transition from Strong PSM to the Weak or Non-Phase-Shifted Features It is again noted that, due to the excessive level of OPE for PSM features, pattern distortion can occur at the feature transition joint from phase-shifted to the weak or non-phaseshifted features. For a relatively long gate (i.e. relative to transistor width), this pattern distortion can be ignored. However, for a shorter gate, the distortion can negatively impact the CD control, similar to the "curved CD" feature phenomenon described in FIGS. 5(a)–5(d). To ensure straight-edged gate features, it is important to apply OPC at the transitional joint.

Figure 12A:
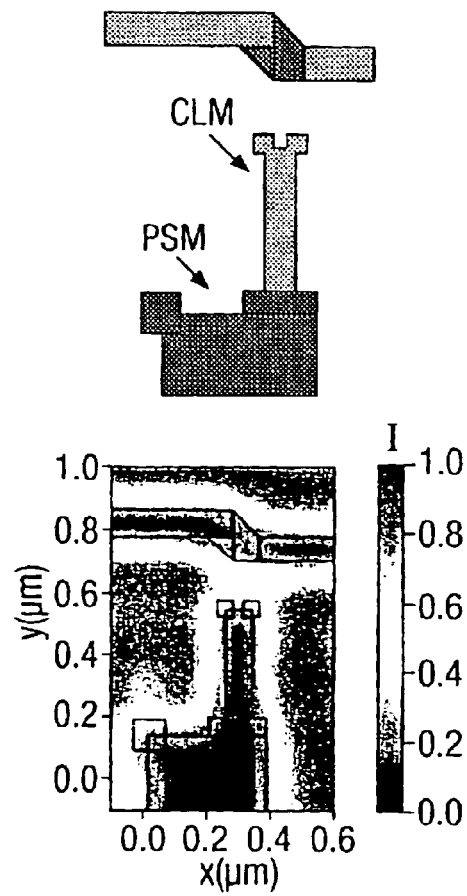
FIG. 12(a)–12(c) illustrate examples of OPC techniques for feature transition joints.
Figure 12A:
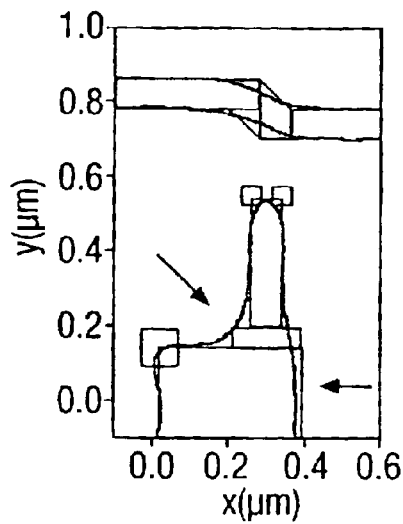

As a result of experiments, it has been observed that the pattern distortion of the "short" gate features is more pronounced when the gate electrode is directly attached to a contact landing pad. This is illustrated in FIG. 12(a) [before OPC], in which "CLM" denotes CLM (strong PSM) features and "PSM" denotes 6% attPSM (weak PSM) features. Fortunately, general layout practice prevents the active area from touching the contact-landing pad, as shown in FIG. 6(a). This helps to relax the OPE in the corner areas. For additional relaxation of OPE, it is possible to create a "space gap" in the gate electrode end that is connected to the contact landing pad. Depending on the nature (i.e. no phase-shift or weak phase-shifted) of the contact landing pad, for best pattern fidelity, the gap should be less than 0.125 ($\lambda$/NA). For a 0.63 NA KrF stepper, the gap should be in the neighborhood of 0.05 $\mu$m at 1× wafer scale. On a 4× mask, this is 0.2 $\mu$m.

Figure 12B:
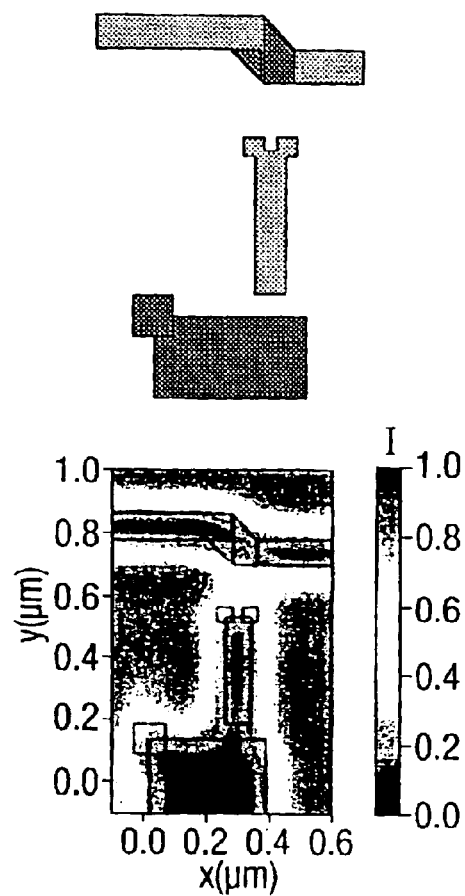
Figure 12B:
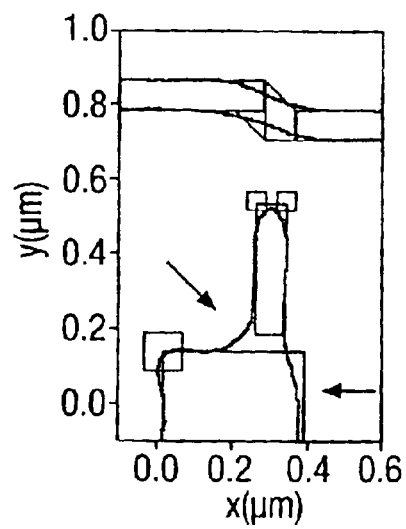
Figure 12C:
Figure 12C:
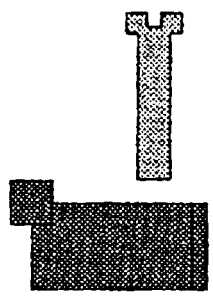
Figure 12C:
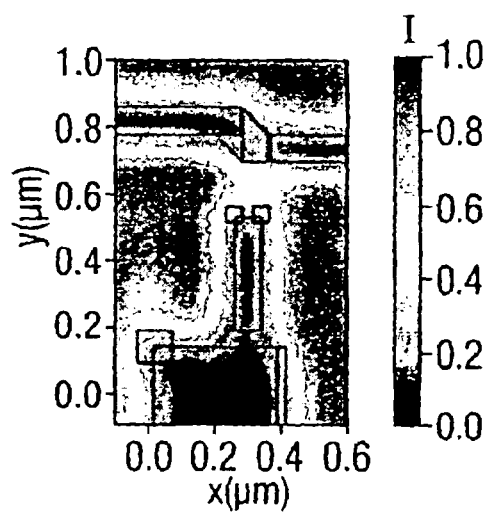
Figure 12C:
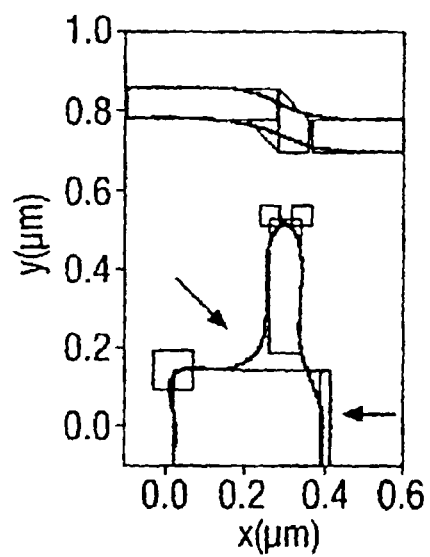

Removing the connecting piece between the contact landing pad and the gate electrode creates a "space gap." As demonstrated in FIG. 12(b), this type of OPC appears sufficient to minimize the corner rounding effect, reducing pattern distortion and ensuring straight edges for the "short" gate. It is noted that additional OPC is also needed for the contact-landing pad. Finally, for larger features, it has been observed that dimensional biasing OPC is acceptable, as is illustrated in FIG. 12(c).

Referring again to FIGS. 12(a)–12(c), it is noted that the top row of FIGS. 12(a)–12(c) illustrates the mask layout with and without OPC. The second row contains aerial image patterns and the third row is the top view of the developed resist patterns. The exposure conditions utilized are set forth in Table I. As shown, without OPC (FIG. 12(a)), the corner rounding is very severe for the "short" gate feature. After applying OPC, as shown in FIGS. 12(b) and 12(c) and mentioned above, the corner rounding is significantly minimized.

As described above, the method of the present invention provides significant advantages over the prior art. Most importantly, the hybrid photomask of the present invention allows for the printing of high resolution "critical" features, while simultaneously allowing for the printing of low resolution "non-critical" features, thereby reducing the overall need for optical proximity correction techniques and providing for improved CD control for "critical" features.

In addition, because the hybrid mask of the present invention requires only one exposure to form the desired features, the overall throughput of the manufacturing process is advantageously increased, by eliminating the need for performing a double exposure and alignment.

In addition, the novel hybrid mask allows separation of the critical features and non-critical features into two different % transmissions. This enables the choice of nominal exposure to focus more on the critical features, with lesser concern for the non-critical ones, which facilitates deciding the optimum exposure for such a mask. Similarly, the optimization for exposure apparatus settings such as illumination settings (e.g. NA, $\sigma$) can be substantially based on only the critical features.

Another advantage is that, because the critical features are now "simplified", with mainly lines and spaces, this allows for utilization of a stronger off-axis illumination to achieve better resolution potential with more depth of focus.

In addition, as the hybrid mask utilizes weaker PSM for the non-critical features, this allows for the printing of non-critical features to be much more robust, since weak PSM can still improve the patterning.

Yet another advantage is that the design of a hybrid mask is relatively straight forward, as compare to the double-exposure altPSM method. Specifically, with the hybrid mask there is no potential phase-conflict to be concerned about. In contrast, the phase-conflict resolution algorithm can be quite complex for the alternating PSM.

Finally, it is also noted that the critical features of the novel hybrid mask can be designed to have a uniform line width, which greatly simplifies the mask making process.

Variations of the hybrid mask of the present invention are also possible. For example, while the hybrid disclosed in the exemplary embodiment set forth above utilizes 4–6% attPSM to form the weak phase-shift features, and chromeless PSM to form the strong phase-shift features, alternatives are possible.

In another variation of the foregoing embodiments, a hybrid mask can be implemented by a two-exposure mask. In this variation, all of the critical features are placed into a separate mask. This "critical feature" mask is a high % transmission attPSM or a chromeless PSM (CLM). The "non-critical" mask, comprising all of the non-critical features, can be either a non-phase-shifting or a weaker PSM (e.g. 4% to 6% attPSM). In this case, the same SB OPC method will need to be applied to the critical exposure mask.

Figure 13A:
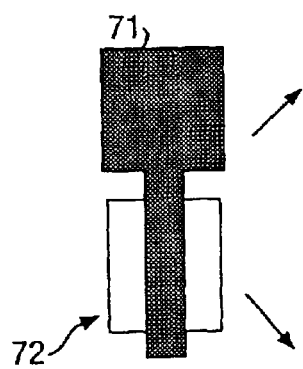
FIGS. 13(a)–13(d) illustrate one possible variation of the hybrid mask of the present invention.
Figure 13B:
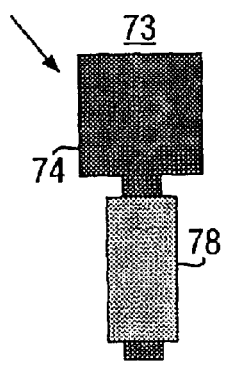
Figure 13C:
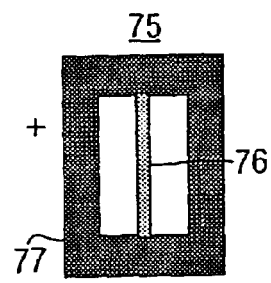
Figure 13D:
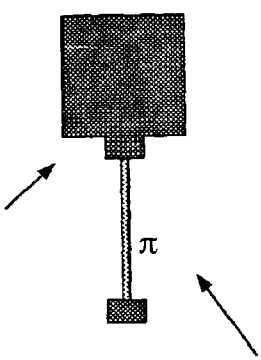

The foregoing variation is illustrated in FIGS. 13(a)–13(d). FIG. 13(a) depicts an exemplary feature to be printed having a gate feature 71 and an active area 72. FIG. 13(b) illustrates the "non-critical" mask 73 representing the non-critical features 74 to be formed. FIG. 13(c) illustrates the "critical" mask 75 representing the critical features 76 to be formed. In forming the desired features, first the non-critical mask 73 is exposed and then the critical mask 75 is exposed. The final result, which is shown in FIG. 13(d) is similar to the exposed pattern formed by utilizing the single-exposure mask version of the hybrid mask detailed above.

It is noted that the critical mask 75 should be surrounded by opaque chrome 77 to block unwanted exposure while only the immediate neighboring areas of those critical gate features are being exposed. With regard to the non-critical mask 73, it can be the same as originally formed, or it can be modified slightly so that the gate electrode area 78 has a slightly larger width. This is required so as to allow more margin of error due to multiple exposures. The benefit of using the two-exposure mask approach is that it is possible to completely de-couple the critical and non-critical features, since they are patterned under two separate mask exposures. However, one disadvantage is the reduction of exposure throughput, because it requires two exposures to form a pattern.

Description of a Lithographic Exposure Apparatus.

Figure 14:
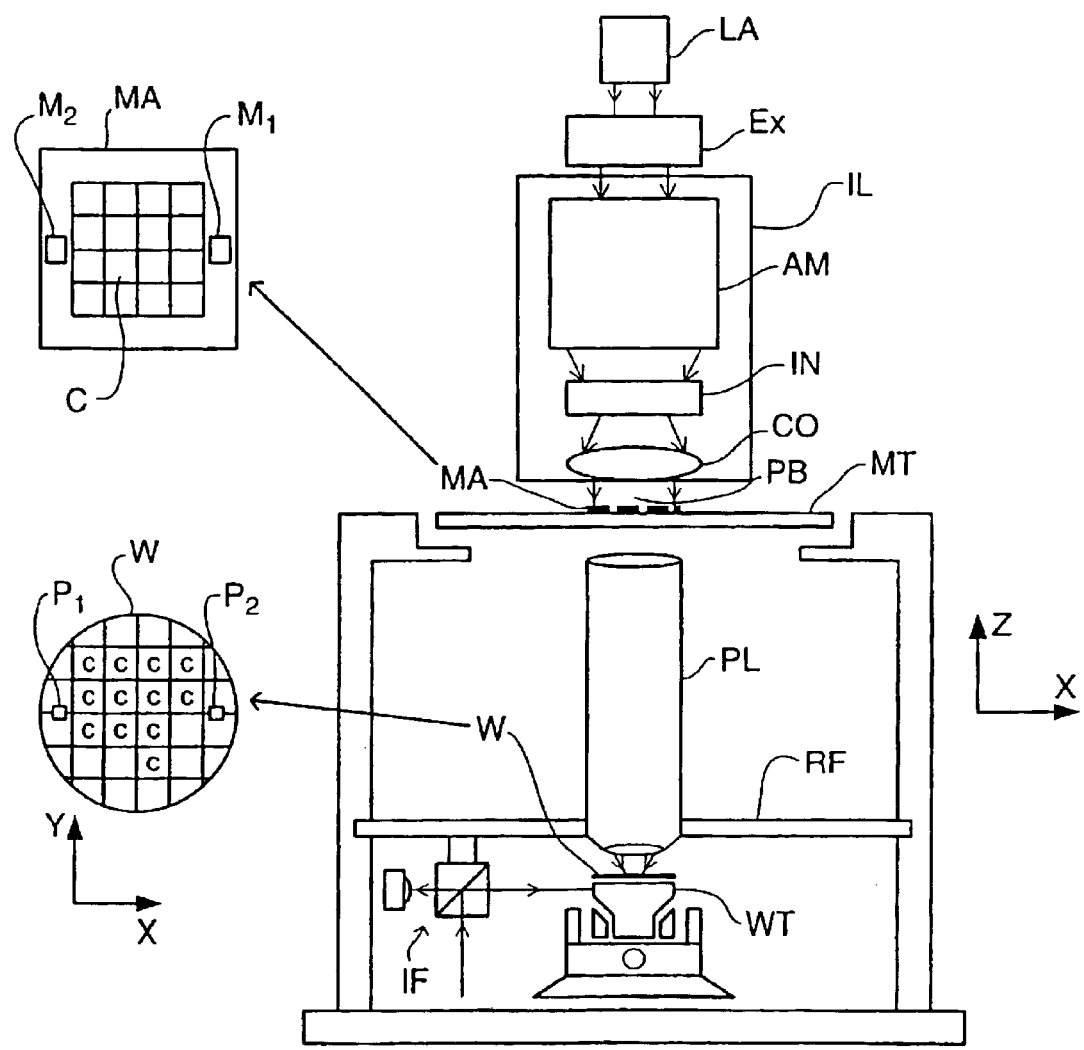
FIG. 14 shows a lithographic exposure apparatus.

FIG. 14 schematically depicts a lithographic apparatus in which the mask according to the invention can be employed. The apparatus comprises:

- a radiation system Ex, IL, for supplying a projection beam PB of radiation (e.g. UV radiation). In this particular case, the radiation system also comprises a radiation source LA;
- a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive, reflective or catadioptric system) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning means, such as a programmable mirror array of a type as referred to above.

The source LA (e.g. a lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 14 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 14. However, in the case of a wafer stepper (as opposed to a step-and-scan apparatus) the mask table MT may just be connected to a short stroke actuator, or may be fixed.

The depicted apparatus can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Although certain specific embodiments of the present invention have been disclosed, it is noted that the present invention may be embodied in other forms without departing from the spirit or essential characteristics thereof. The present embodiments are therefor to be considered in all respects as illustrative and not restrictive, the scope of the invention being indicated by the appended claims, and all changes that come within the meaning and range of equivalency of the claims are therefore intended to be embraced therein.

What is claimed is:

1. A mask for imaging a lithographic pattern by use of a lithographic exposure apparatus, said mask comprising:
    a substrate;
    a first pattern corresponding to at least one non-critical feature to be imaged, said first pattern comprising one of a low-transmission phase-shift feature and a non-phase-shifting feature formed on said substrate,
    a second pattern corresponding to at least one critical feature to be imaged, said second pattern comprising a chromeless phase-shift feature generated by etching said substrate, and
    at least one optical proximity correction feature for reducing optical proximity effects.

2. A mask according to claim 1, wherein said optical proximity correction feature comprises a scattering bar disposed adjacent at least one of said first pattern and said second pattern.

3. A mask according to claim 1, wherein said optical proximity correction feature comprises a serif disposed on an end portion of at least one said first pattern and said second pattern.

4. A mask according to claim 1, further comprising a third pattern corresponding to an angled feature which extends at an angle relative to at least one of the first pattern and the second pattern, said third pattern comprising one of a low-transmission phase-shift feature, a weak phase-shift feature and a non-phase-shifting feature.

5. A mask according to claim 1, wherein said first pattern can further be implemented utilizing a weak phase-shift feature.

6. A mask according to claim 1, wherein said low-transmission phase-shift feature comprises a 5–8% transmission attenuated phase-shift feature.

7. A mask according to claim 1, wherein said low-transmission phase-shift feature comprises a non-phase-shifting chrome feature.

8. A mask according to claim 1, wherein said chromeless phase-shift feature exhibits 100% transmission.

9. A method of forming a mask on a substrate for imaging a lithographic pattern by use of a lithographic exposure apparatus, said method comprising the steps of:
    forming a first pattern on said substrate corresponding to at least one non-critical feature to be imaged, said first pattern comprising one of a low-transmission phase-shift feature and a non-phase-shifting feature,
    forming a second pattern on said substrate corresponding to at least one critical feature to be imaged, said second pattern comprising a chromeless phase-shift feature generated by etching said substrate, and at least one optical proximity correction feature for reducing optical proximity effects.

10. A method according to claim 9 wherein said optical proximity correction feature comprises a scattering bar disposed adjacent at least one of said first pattern and said second pattern.

11. A method according to claim 9, wherein said optical proximity correction feature comprises a serif disposed on an end portion of at least one said first pattern and said second pattern.

12. A method according to claim 9, further comprising forming a third pattern corresponding to an angled feature which extends at an angle relative to at least one of the first pattern and the second pattern, said third pattern comprising one of a low-transmission phase-shift feature, a weak phase-shift feature and a non-phase-shifting feature.

13. A method according to claim 9, wherein said first pattern can further be implemented utilizing a weak phase-shift feature.

14. A method according to claim 9, wherein said low-transmission phase-shift feature comprises a 5–8% transmission attenuated phase-shift feature.

15. A method according to claim 9, wherein said low-transmission phase-shift feature comprises a non-phase-shifting chrome feature.

16. A method according to claim 9, wherein said chromeless phase-shift feature exhibits 100% transmission.

17. A method according to claim 9, further comprising the step of subjecting said mask to a single exposure utilizing said lithographic exposure apparatus, said single exposure operative for printing both said critical feature and said non-critical feature.

18. A device manufacturing method comprising the steps of:
    (a) providing a first substrate that is at least partially covered by a layer of radiation-sensitive material;
    (b) providing a projection beam of radiation using a radiation system;
    (c) using a pattern on a mask to endow the projection beam with a pattern in its cross-section;
    (d) projecting the patterned beam of radiation onto a target portion of the layer of radiation-sensitive material,
    wherein, in step (c), use is made of a mask comprising:
    a second substrate;
    a first pattern corresponding to at least one non-critical feature to be printed on said first substrate, said first pattern comprising one of a low-transmission phase-shift feature and a non-phase-shifting feature formed on said second substrate,
    a second pattern corresponding to at least one critical feature to be printed on said first substrate, said second pattern comprising a chromeless phase-shift feature generated by etching said second substrate, and
    at least one optical proximity correction feature for reducing optical proximity effects.

19. The device manufacturing method according to claim 18, wherein said optical proximity correction feature comprises a scattering bar disposed adjacent at least one of said first pattern and said second pattern.

20. The device manufacturing method according to claim 18, wherein said optical proximity correction feature comprises a serif disposed on an end portion of at least one said first pattern and said second pattern.

21. The device manufacturing method according to claim 18, further comprising a third pattern corresponding to an angled feature which extends at an angle relative to at least one of the first pattern and the second pattern, said third pattern comprising one of a low-transmission phase-shift feature, a weak phase-shift feature and a non-phase-shifting feature.

22. The device manufacturing method according to claim 18, wherein said first pattern can further be implemented utilizing a weak phase-shift feature.

23. The device manufacturing method according to claim 18, wherein said low-transmission phase-shift feature comprises a 5–8% transmission attenuated phase-shift feature.

24. The device manufacturing method according to claim 18, wherein said low-transmission phase-shift feature comprises a non-phase-shifting chrome feature.

25. The device manufacturing method according to claim 18, wherein said chromeless phase-shift feature exhibits 100% transmission.

26. A computer program product for controlling a computer comprising a recording medium readable by the computer, means recorded on the recording medium for directing the computer to generate at least one file corresponding to a mask for use in a lithographic imaging process, said generation of said file comprising the steps of:
    generating data representing a first pattern corresponding to at least one non-critical feature to be printed on a wafer, said first pattern comprising one of a low-transmission phase-shift feature and a non-phase-shifting feature,
    generating data representing a second pattern corresponding to at least one critical feature to be printed on said wafer, said second pattern comprising a chromeless phase-shift feature generated by etching a substrate, and
    at least one optical proximity correction feature for reducing optical proximity effects.

27. The computer program product according to claim 26, wherein said optical proximity correction feature comprises a scattering bar disposed adjacent at least one of said first pattern and said second pattern.

28. The computer program product according to claim 26, wherein said optical proximity correction feature comprises a serif disposed on an end portion of at least one said first pattern and said second pattern.

29. The computer program product according to claim 26, further comprising a third pattern corresponding to an angled feature which extends at an angle relative to at least one of the first pattern and the second pattern, said third pattern comprising one of a low-transmission phase-shift feature, a weak phase-shift feature and a non-phase-shifting feature.

30. The computer program product according to claim 26, wherein said first pattern can further be implemented utilizing a weak phase-shift feature.

31. The computer program product according to claim 26, wherein said low-transmission phase-shift feature comprises a 5–8% transmission attenuated phase-shift feature.

32. The computer program product according to claim 26, wherein said low-transmission phase-shift feature comprises a non-phase-shifting chrome feature.

33. The computer program product according to claim 26, wherein said chromeless phase-shift feature exhibits 100% transmission.

* * * * *